United States Patent
Kobayashi et al.

(10) Patent No.: US 8,029,874 B2
(45) Date of Patent: Oct. 4, 2011

(54) PLASMA PROCESSING APPARATUS AND METHOD FOR VENTING THE SAME TO ATMOSPHERE

(75) Inventors: Hiroyuki Kobayashi, Kodaira (JP); Kenji Maeda, Koganei (JP); Kenetsu Yokogawa, Tsurugashima (JP); Masaru Izawa, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 750 days.

(21) Appl. No.: 12/035,759

(22) Filed: Feb. 22, 2008

(65) Prior Publication Data

US 2009/0183683 A1    Jul. 23, 2009

(30) Foreign Application Priority Data

Jan. 22, 2008    (JP) .................................. 2008-011185

(51) Int. Cl.
*H05H 1/24*    (2006.01)

(52) U.S. Cl. ...................................................... 427/569

(58) Field of Classification Search .................... 427/569
See application file for complete search history.

(56) References Cited

U.S. PATENT DOCUMENTS

2006/0016559 A1*    1/2006    Kobayashi et al. ...... 156/345.34

FOREIGN PATENT DOCUMENTS

| JP | 2002-246374 | | 8/2002 |
|---|---|---|---|
| JP | 2002246374 A | * | 8/2002 |
| JP | 2006-041088 | | 2/2006 |

* cited by examiner

*Primary Examiner* — Kelly M Gambetta
(74) *Attorney, Agent, or Firm* — Antonelli, Terry, Stout & Kraus, LLP.

(57) ABSTRACT

In a plasma processing apparatus provided with control means, gas supply means includes a first gas supply path for supplying a vent gas into a processing chamber by way of a shower plate and a second gas supply path for supplying a vent gas into the processing chamber without via the shower plate, and the control means is capable of adjusting a flow rate of the vent gas of at least one of the first and second gas supply paths in such a manner that a pressure on a back side of the shower plate becomes a pressure that is a positive pressure relative to a pressure in the processing chamber and less than a withstand pressure of the shower plate.

4 Claims, 9 Drawing Sheets

PLASMA PROCESSING APPARATUS AND METHOD FOR VENTING THE SAME TO ATMOSPHERE

CLAIM OF PRIORITY

The present application claims priority from Japanese application JP 2008-011185 filed on Jan. 22, 2008, the content of which is hereby incorporated by reference into this application.

FIELD OF THE INVENTION

The present invention relates to a plasma processing apparatus and a method for venting the same to atmosphere and, more particularly, to a plasma processing apparatus which is provided with vent gas supply means for supplying vent gas and then returning the interior of a processing chamber to an atmospheric pressure state from a decompressed state, and a method for venting the same to atmosphere.

BACKGROUND OF THE INVENTION

Heretofore, a process utilizing plasma etching or plasma CVD is adopted widely in the process of fabricating a semiconductor device such as a DRAM or a microprocessor.

In many apparatuses such as plasma processing apparatuses that perform etching under decompressed states, shower plates having plural fine gas holes formed therein are employed in order to uniformly supply processing gases to objects to be processed. The material of the shower plate is, for example, Si or quartz. During a normal process, the processing gas is supplied to a back surface side of the shower plate (a plane side reverse to an inner side of the processing chamber) and then supplied into the processing chamber via the gas holes formed in the shower plate.

A plasma processing apparatus in which, in order to control the in-plane uniformity of the process shape of an object to be processed, during such a general process, processing gases are divided by distributors and supplied to a gas processing chamber via two gas supply paths which are respectively provided with mass-flow controllers, is disclosed in Japanese Patent Application Laid-Open (JP-A) No. 2006-41088.

On the other hand, as one of subjects in processing a semiconductor device, there is given a subject of reducing the number of foreign particles adhering to the object to be processed. For example, when any foreign material particles fall onto a fine pattern of the object during or prior to etching processing, the etching with respect to the portion of the object is locally prevented. As a result, a fault such as disconnection is brought about, thus causing a reduction in the yield of the semiconductor device. For this reason, there have been proposed many methods wherein, for example, the flow of the gas is controlled to thereby control the transport of the foreign material particles and the number of the foreign particles adhering to the object to be processed is reduced.

Incidentally, in a processing apparatus such as a semiconductor device fabricating apparatus which performs predetermined processing under a decompressed state, a processing chamber is returned to an atmospheric pressure state from the decompressed state by supplying vent gas such as nitrogen or dry air into the processing chamber at the time of maintenance such as total cleaning. At this time, the foreign material particles are flown up by the flow of the vent gas and the flown-up foreign material particles are wafted by the flow of the vent gas in the processing chamber and scatter, and there is a problem that, for example, the interiors of the gas pipes of a gas supply system and/or the back side of a shower plate will be contaminated by the foreign material particles. If the gas supply system on the back side of the shower plate, etc. is contaminated by the foreign material particles at the time of the total cleaning, the foreign material particles are scattered into the processing chamber from the gas supply system according to the supply of processing gas during processing of an object to be processed after the total cleaning, and the yield of a semiconductor device may be reduced.

As a method for coping with this, there has been proposed a method in which, as described in, for example, JP-A No. 2006-41088, a high pressure gas is supplied to the side of the processing chamber from the gas supply system during venting, to thereby prevent the foreign material particles from entering.

SUMMARY OF THE INVENTION

In such a conventional plasma processing apparatus with the processing gas supply system as disclosed in JP-A No. 2002-246374, a problem arising when the vent gas is supplied into the processing chamber and the processing chamber is vented to atmosphere after finishing of a normal process will be discussed with reference to FIGS. 8 and 9. FIG. 8 shows pressure changes of the back side of the shower plate and the processing chamber at the time of returning the processing chamber to atmosphere from vacuum. FIG. 9 shows a schematic enlarged view of a part of the back side of the shower plate. Vent gas (for example, nitrogen gas) is supplied at a flow rate $F_C$ into the processing chamber from a vent gas supply system provided independently of processing gas supply systems. The flow rates $F_G$ of the vent gases supplied from the processing gas supply systems 13-1, 13-2 amount to zero. Here, the term "vacuum" shall indicate a pressure which is not more than, for example, several tens Pa. At the time t10 in FIG. 8, the supply of the vent gas to the processing chamber is commenced and stopped at the timing t20 of the processing chamber becoming an atmospheric pressure.

In this case, as indicated in FIG. 9 by solid lines, the vent gas supplied into the processing chamber is supplied, via gas holes of the shower plate 5, toward the processing gas supply systems 13-1, 13-2 on the back side of the shower plate. This is because a pressure on the back side of the shower plate is low relative to a pressure in the processing chamber during venting. Therefore, as indicated in FIG. 9 by dotted lines 51, foreign material particles 50 which are flown up in the processing chamber by the supply of the vent gases enter the back side of the shower plate from the side of the processing chamber by the flow of the gases, and the back side of the shower plate and/or the interiors of the pipes of the processing gas supply systems are contaminated by the foreign material particles.

Next, a problem in the method will be discussed which is described in JP-A No. 2002-246374 and wherein, when the processing chamber is vented to atmosphere, the high pressure gas is supplied, via the shower plate, into the processing chamber from the gas supply system.

In the case of an etching processing apparatus, the pressure on the back side of the shower plate is, for example, 1 KPa and the pressure in the processing chamber is, for example, 10 Pa. That is, the pressure on the back side of the shower plate is normally adapted to become higher than the pressure in the processing chamber by more than one order of magnitude. Therefore, such a force as to push the shower plate from the back side toward the interior of the processing chamber is applied to the shower plate by the processing gas. If, for example, the pressure on the back side of the shower plate is 1 KPa and an area to which the pressure is applied is 35 cm in diameter, this force is about 10 Kg. In this case, a withstand pressure of the shower plate is set to, for example, 100 Kg, and the number and strength of screws for fixing the shower plate, the thickness of the shower plate, etc. may be determined.

However, if vent gas at a pressure of a level equivalent to the atmospheric pressure is supplied to the back side of the shower plate when the interior of the processing chamber is in a vacuum state at the time of commencing to vent, the pressure which is applied to the back side of the shower plate becomes 1000 Kg and the shower plate whose withstand pressure is, for example, 100 Kg is broken.

On the other hand, in a case where the vent gas is supplied toward the processing chamber, at a pressure differential of the same level as at the time of supplying the processing gas during the normal process, the breakage of the shower plate is avoided, but considerable time is required for increasing the pressure in the processing chamber to the atmospheric pressure.

An object of the present invention is to provide a plasma processing apparatus and method for venting to atmosphere which solve the various problems of the above prior art, prevent the back side of a shower plate and/or the interiors of pipes of a processing gas supply system from being contaminated by foreign material particles, may not cause the damage of the shower plate, and can reduce a venting time.

Representative of the present invention is as follows. That is, the present invention provides a plasma processing apparatus including a processing chamber for processing an object to be processed, evacuation means for decompressing the processing chamber, a sample holding electrode being provided in the processing chamber, a shower plate provided in confronting relation with the sample holding electrode, gas supply means for supplying a gas into the processing chamber, plasma generation means for generating plasma in the processing chamber, and control means, wherein the gas supply means includes a first gas supply path for supplying a vent gas into the processing chamber by way of the shower plate and a second gas supply path for supplying a vent gas into the processing chamber without via the shower plate, and the control means is capable of adjusting a flow rate of the vent gas of at least one of the first and second gas supply paths in such a manner that a pressure on a back side of the shower plate becomes a pressure that is a positive pressure relative to a pressure in the processing chamber and less than a withstand pressure of the shower plate.

According to the present invention, the venting is carried out while suppressing the pressures of the back and front sides of the shower plate in the predetermined range, so that the venting is performed without damaging the shower plate while supplying the gases from shower plate, whereby it is possible to prevent the back side of the shower plate from being contaminated by the foreign material particles. Moreover, it is possible to reduce a venting time and reduce the resting time of the apparatus that is taken for total cleaning, so that the productivity of the apparatus is increased.

DETAILED DESCRIPTION OF THE PREFERRED EMBODIMENTS

According to a typical embodiment of the present invention, in a semiconductor device fabricating apparatus which includes a processing chamber, means for supplying processing gas into the processing chamber, a shower plate provided in an upper electrode, evacuation means for decompressing the processing chamber, vent gas supply means for supplying vent gases when the processing chamber is vented to atmosphere, and control means, the vent gas supply means is designed so as to serve as a part of the gas supply means for supplying the processing gas into the processing chamber, and performs the supply of vent gas into the processing chamber is carried out via a first gas-supplying path going by way of the shower plate and also performs the supply of vent gas into the processing chamber via a second gas-supplying path which does not go by way of the shower plate, while adjusting a pressure, applied to the back surface of the shower plate during venting, so as to cause the pressure to become a positive pressure relative to a pressure in the processing chamber at a predetermined pressure differential.

According to an embodiment of the present invention, the pressure differential is measured by utilizing pressure gauges and a vent control program is provided for controlling the flow rate of the gas supplied from the shower plate and the flow rate of the vent gas supplied into the processing chamber without via the shower plate, in such a manner that the pressure on the back side of the shower plate becomes a positive pressure in a predetermined range, relative to the pressure in the processing chamber, and for carrying out the venting.

Moreover, in lieu of employing the pressure gauge, patterns of the flow rates of the vent gases supplied into the processing chamber from the first and second gas supply paths may be previously given to a recipe of the vent control program and the control of the pressure differential may be carried out by adjusting the respective flow rates.

Embodiments of the present invention will be discussed hereinafter with reference to the accompanying drawings.

First Embodiment

Referring to FIGS. 1 to 6, a first embodiment of the present invention will be discussed hereinafter.

Figure 1:
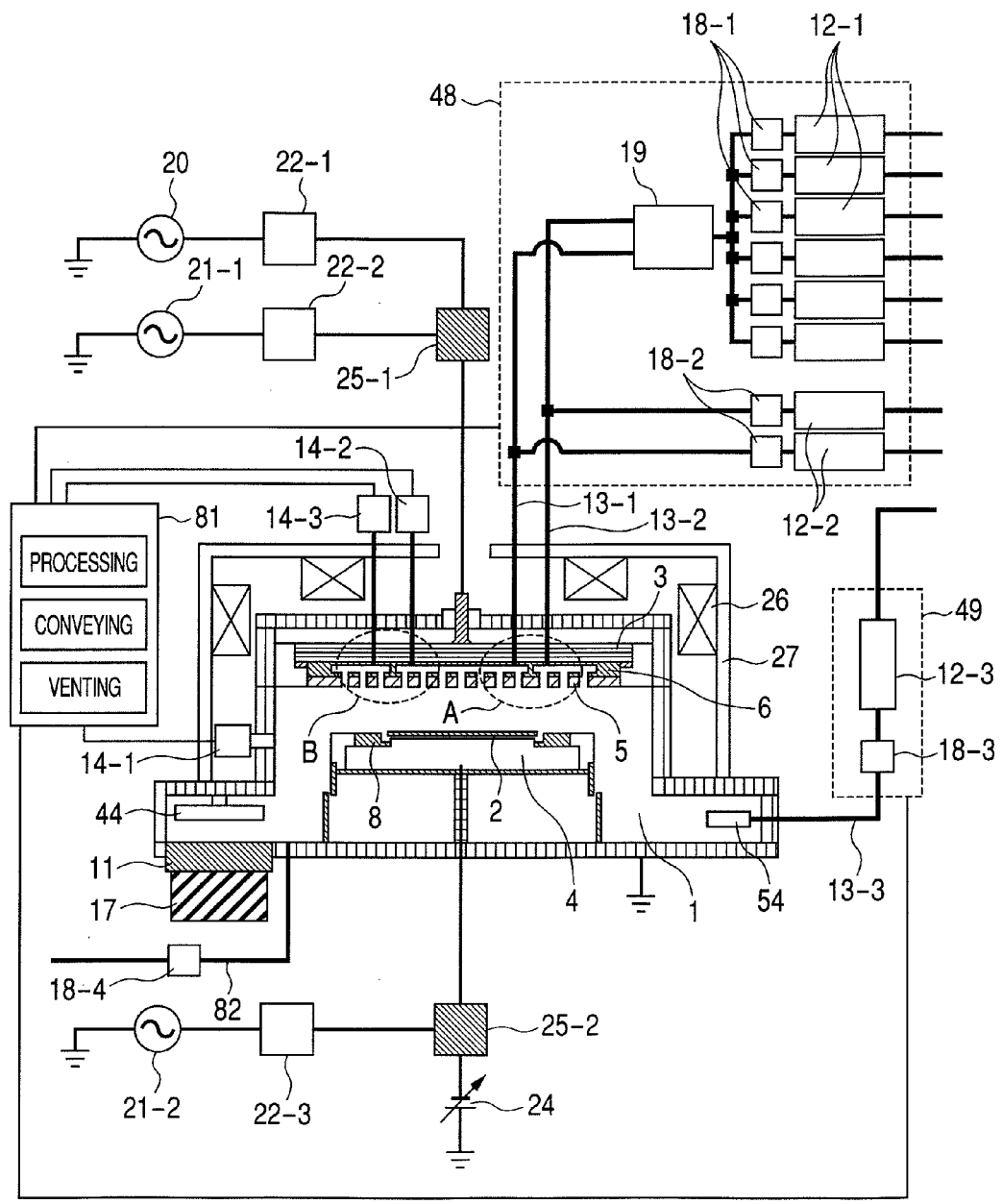
FIG. 1 is a view showing a first embodiment in which the present invention is applied to a parallel-plate UHF-ECR plasma etching apparatus.

Referring first to FIG. 1, there is illustrated the first embodiment in which the present invention is applied to a parallel-plate UHF-ECR plasma etching apparatus.

As an upper electrode, a planar antenna 3 for electromagnetic radiation is disposed in an upper portion of a processing chamber 1 so as to be parallel to a sample holding electrode 4 on which an object 2 to be processed is placed. A high frequency electromagnetic radiation power supply 20 for plasma generation and a high frequency bias power supply 21-1 for applying bias to the antenna 3 are connected to the antenna 3 via matching networks 22-1, 22-2 and a filter 25-1. A high frequency bias power supply 21-2 for accelerating ions being incident on the object 2 is connected to the sample holding electrode 4 via a matching network 22-3. A DC power supply 24 is connected to the sample holding electrode 4 via a filter 25-2. Moreover, a focus ring 8 is provided around an outer periphery of an upper portion of the sample holding electrode 4. The sample holding electrode 4 is adapted to be capable of being moved vertically by a vertical drive mechanism. A gas dispersion plate 6 and a shower plate 5 are disposed below the antenna 3. Processing gases for plasma generation are supplied into the processing chamber via plural gas holes 7 which are provided in the gas dispersion plate 6 and the shower plate 5. Incidentally, the respective gas holes 7 of the shower plate 5 are provided correspondingly to the respective gas holes of the gas dispersion plate 6, and hole diameters of the gas holes of the shower plate 5 are smaller than those of the gas holes of the gas dispersion plate 6.

The processing gases to be supplied into the processing chamber via the shower plate 5 are supplied via gas lines 13-1, 13-2 from a gas supply system 48. The processing gases introduced to the processing chamber 1 include, for example, Ar, $CHF_3$, $CH_2F_2$, $CF_4$, $C_4F_6$, $C_4F$, $C_5F_8$, CO, $O_2$, $N_2$, $CH_4$, $CO_2$, $H_2$, etc. The gas supply system 48 includes gas sources of the various gases (not shown), plural mass-flow controllers 12-1, 12-2, plural valves 18-1, 18-2, and a gas distributor 19. On the side of the processing chamber, a coil 26 and a yoke 27 are provided for generating a magnetic field in the processing chamber.

In order that processing gases supplied from an inner region in the plane of the shower plate and processing gases supplied at a region outside the inner region are controlled in their flow rates and compositions independently relative to each other, the gas dispersion plate 6 is divided into two regions of an inner region and an outer region. The processing gas is adapted to be divided by the gas distributor 19 into predetermined flow ratios and then supplied to the respective regions through the gas lines 13-1, 13-2. In order to control a uniformity of a process shape in the plane of the object to be processed, gases are adapted to be added, through the mass-flow controllers 12-2, to the two gases divided by the gas distributor. Regarding the details of operation, effect, etc. of this function, JP-A No. 2006-41088 is incorporated by reference.

Moreover, connected to the processing chamber 1 is a vent gas supply system 49 for supplying gas into the processing chamber (a gas to be supplied for venting is here referred to as a vent gas) at the time of venting the processing chamber to atmosphere. The vent gas supply system 49 includes a mass-flow controller 12-3 and a valve 18-3 and is connected through a gas line 13-3 to a gas diffuser 54 serving as a gas supply section in the processing chamber.

The gas supply system 48 and the vent gas supply system 49 are controlled by a control computer 81.

A turbo molecular pump 17 for decompressing the processing chamber is mounted to the processing chamber. Moreover, in order to control the pressure in the processing chamber, a butterfly valve 11 is disposed above the turbo molecular pump 17. Further, in order to prevent residual gas in the processing chamber from being discharged out of the processing chamber when the processing chamber 1 is vented to atmosphere and opened, an exhaust duct 82 is connected to the processing chamber 1. The interior of the exhaust duct 82 is rendered into a slight negative pressure compared with the atmospheric pressure. When the processing chamber is to be opened after the venting, a valve 18-4 is opened and the air in the processing chamber is evacuated via the exhaust duct 82 and injury eliminating equipment (not shown). Reference numeral 44 denotes a main valve.

A pressure gauge 14-1 for measuring the pressure in the processing chamber is mounted to the processing chamber. Moreover, pressure gauges 14-2, 14-3 are installed to measure a pressure at the back plane of the shower plate. The pressure gauge 14-2 serves as means for measuring a pressure at an inner side of the shower plate. The pressure gauge 14-3 acts as means for measuring a pressure at an outer side of the shower plate.

Figure 2:
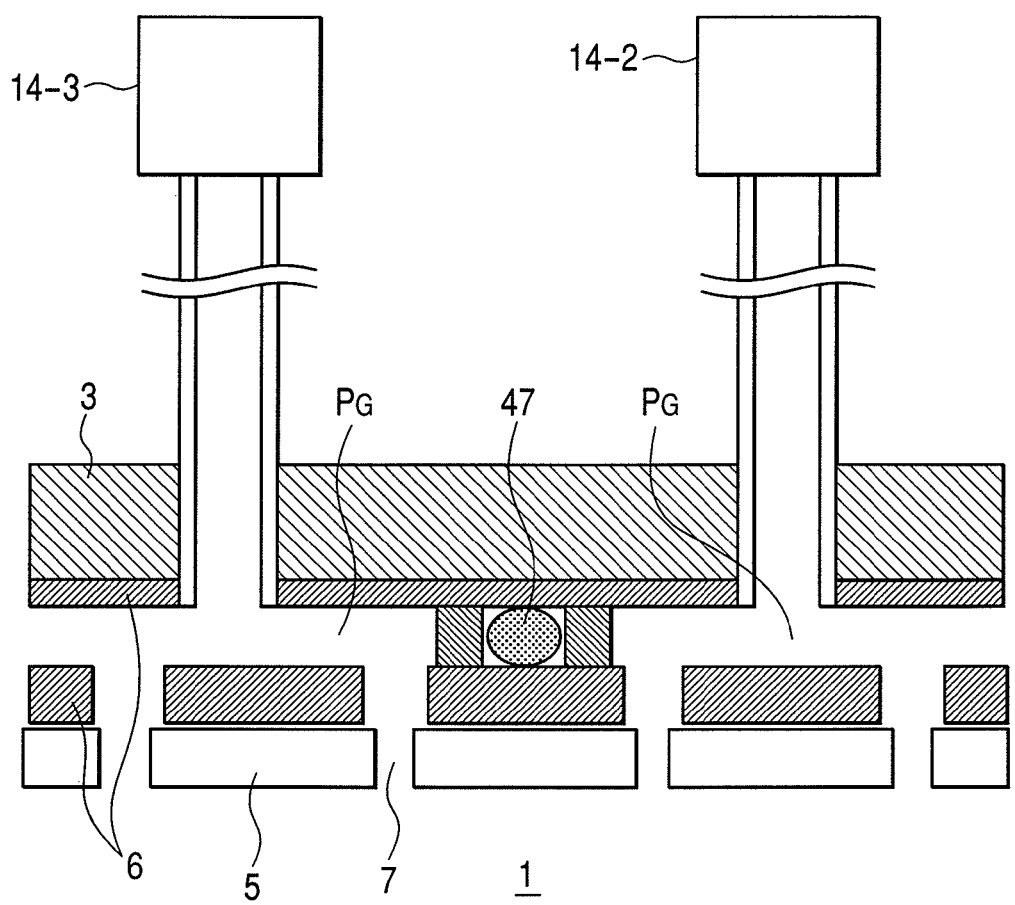
FIG. 2 is a view schematically showing a region B in FIG. 1, namely, a portion to which pressure gauges for measuring a pressure on the back side of a shower plate are connected.

Further, FIG. 2 schematically illustrates a region B in FIG. 1, namely, a portion to which the pressure gauges for measuring the pressure on the back side of the shower plate are connected. The gas dispersion plate 6 is divided by an O-ring 47 into two regions, an inner region and an outer region. A structure in which the pressure gauges are respectively connected directly to the two regions on the back side of the shower plate (more concretely, the gas dispersion plate 6) to directly measure the pressure on the back side of the shower plate is employed. Alternatively, if the pressure gauges are connected to, for example, middles of gas pipes (gas lines 13-1, 13-2) between the gas supply system 48 and the back plane of the shower plate, they measure pressures in the gas pipes which the gases flow, without measuring the pressure on the back side of the shower plate, so that such an arrangement is not desirable.

The plasma processing apparatus according to the present invention is adapted to be automatically controlled as a whole by control means, for example, the control computer 81. This control computer includes a CPU, a memory, a storage device, programs maintained in the storage device for performing predetermined arithmetic operations according to the CPU, a display, a mouse, a keyboard, etc. As the programs, there are included a plasma processing program for performing plasma processing with respect to a substrate to be processed in the processing chamber, a conveyance program for controlling the conveying of the substrate to be processed between the processing chamber in vacuum atmosphere and a FOUP (Front Opening Unified Pod) or cassette in atmospheric atmosphere, a vent program for adjusting the flow rate of the vent gas supplied into the processing chamber when the processing chamber in vacuum is vented to atmosphere (venting), etc.

In FIG. 1, connection to the control computer is shown with respect to only a part that is essential to the present invention and, for example, connection between a high frequency power source and the control computer has been left out of the illustration.

Moreover, various recipes that include a recipe for plasma processing of the substrate to be processed, a recipe for conveying of the substrate to be processed, and recipes for cleaning of the processing chamber and venting of the processing chamber to atmosphere, are maintained in the storage device of the control computer. These recipes also include recipes concerning gas flow control for adjusting the flow rate of the processing gas, the flow rate of purge gas at the time of conveying the substrate to be processed, and the flow rate of the vent gas. Incidentally, these recipes concerning the gas supply control may be provided for the respective steps of plasma processing, conveying, cleaning the processing chamber, and venting the processing chamber to atmosphere. Alternatively, for processing forms of the substrate to be processed, they may be configured as a series of recipes applied over the plasma processing of the substrate to be processed, the conveying, the cleaning of the processing chamber, and the venting of the processing chamber to atmosphere.

The control means 81 is equipped with the function of adjusting, on the basis of a predetermined program and recipe, the flow rate of the vent gas of at least one of the first gas supply path 48 going by way of the shower plate and the second gas supply path 49 which does not go by way of the shower plate, in such a manner that the pressure at the back plane of the shower plate 5 becomes a pressure that is a positive pressure relative to the pressure in the processing chamber 1 and less than the withstand pressure of the shower plate.

Next, referring to the time chart of FIG. 3, an example of the function of adjusting the flow rate of the vent gas will be discussed.

As the timing of allowing the gas for venting to flow, the supply of the gas for venting via the shower plate is firstly commenced (t1) and the vent gas is then supplied from the vent gas supply system (t2). When the pressure gauge 14-1 installed in the processing chamber 1 detects atmospheric pressure, the supply of the vent gas from the vent gas supply system is stopped (t3) and, thereafter, the supply of the vent gas via the shower plate is stopped (t4).

For at least a period from the timing (t2) to the timing (t3), the control means 81 adjusts the flow rate of the vent gas of at least one of the first and second gas supply paths in such a manner that the pressure at the back plane of the shower plate always becomes a positive pressure by a pressure differential $P_D$, relative to the pressure in the processing chamber. That is, in the case where the vent gas is supplied from the vent gas-supply system, at the timing (t2) of the pressure on the back side of the shower plate becoming a pressure that is less than a withstand pressure of the shower plate and that is a positive pressure by the pressure differential $P_D$, the supply of the vent gas into the processing chamber from the second gas supply path is commenced. Moreover, at the timing (t3) of the pressure in the processing chamber reaching the atmospheric pressure, the supply of the vent gas from the second gas supply path is stopped. Even after the supply of the vent gas to the processing chamber from the second gas supply path is stopped, the supply of the vent gas into the processing chamber from the first gas supply path is continued. At the timing (t4) after predetermined time has elapsed, the supply of the vent gas into the processing chamber from the first gas supply path is stopped.

Incidentally, in lieu of employing the pressure gauges, data on desirable patterns of the flow rates of the vent gases supplied into the processing chamber for each processing condition of substrate to be processed, from the first and second gas supply paths may be previously obtained from experiments, etc. and patterns of the flow rates of the vent gases supplied into the processing chamber from the first and second gas supply paths may be given to the recipe of the vent control program on the basis of the data. Thereby, the venting can also be performed while adjusting the pressure applied to the back plane of the shower plate and the pressure in the processing chamber during the venting, without utilizing the pressure gauges.

Figure 3:
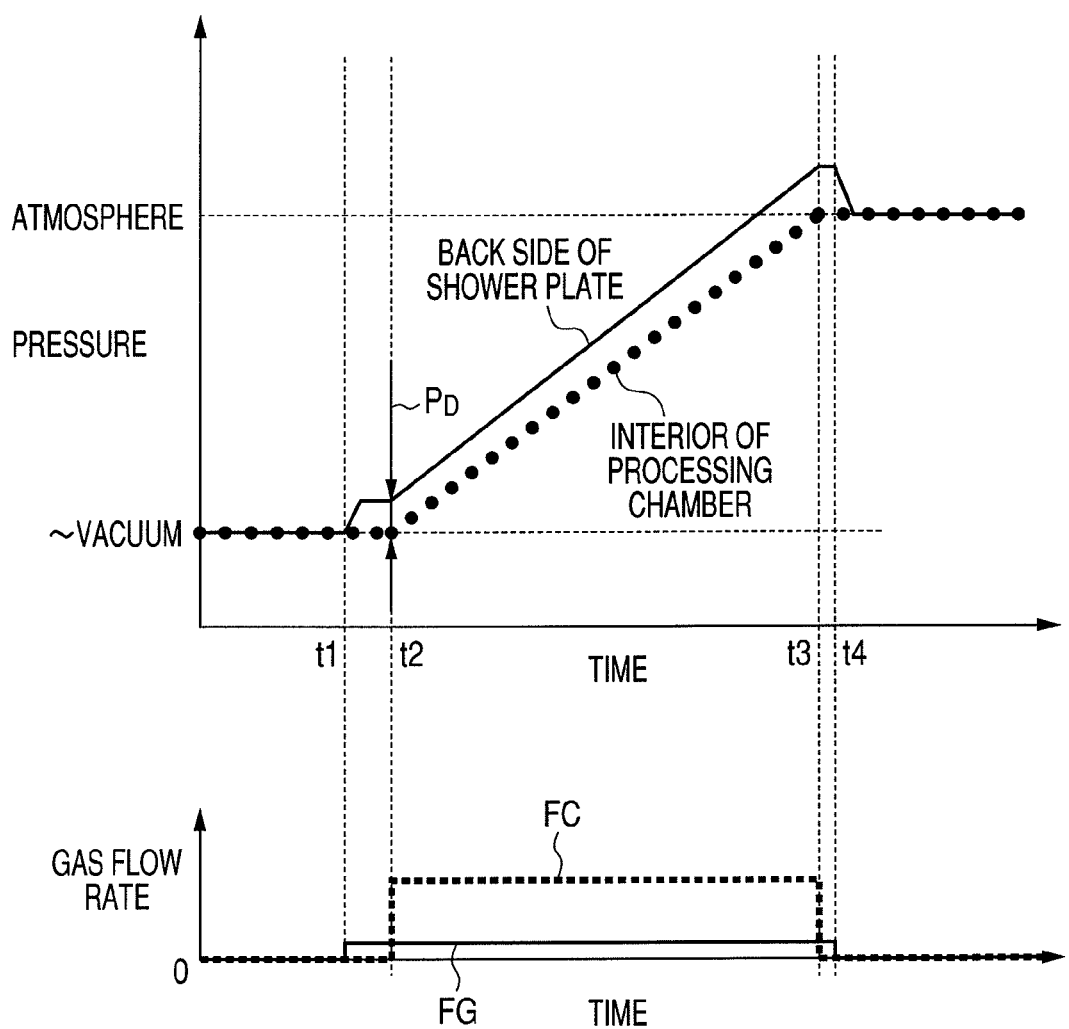
FIG. 3 is a view illustrating an example of a time chart of adjusting the flow rate of gas by control means in the first embodiment.

Moreover, although not shown in FIG. 3, when the apparatus is to be opened after the completing of the venting, a valve 18-4 is previously opened and the residual gas is evacuated from the exhaust duct. Further, at the same time, the supply of the vent gas from the gas supply system 48 via the shower plate or the supply of the vent gas from the vent gas supply system 49 may be continued. That is, after the timing (t4), the supply of the predetermined amount of the vent gas into the processing chamber from the first gas supply path may be continued. As the vent gases, dry air or nitrogen gas are desirable. The flow rate of each vent gas may be the same level as that of the vent gas supplied from the shower plate during the venting. Thereby, air containing moisture in a clean room is prevented from entering the gas supply systems.

Figure 8:
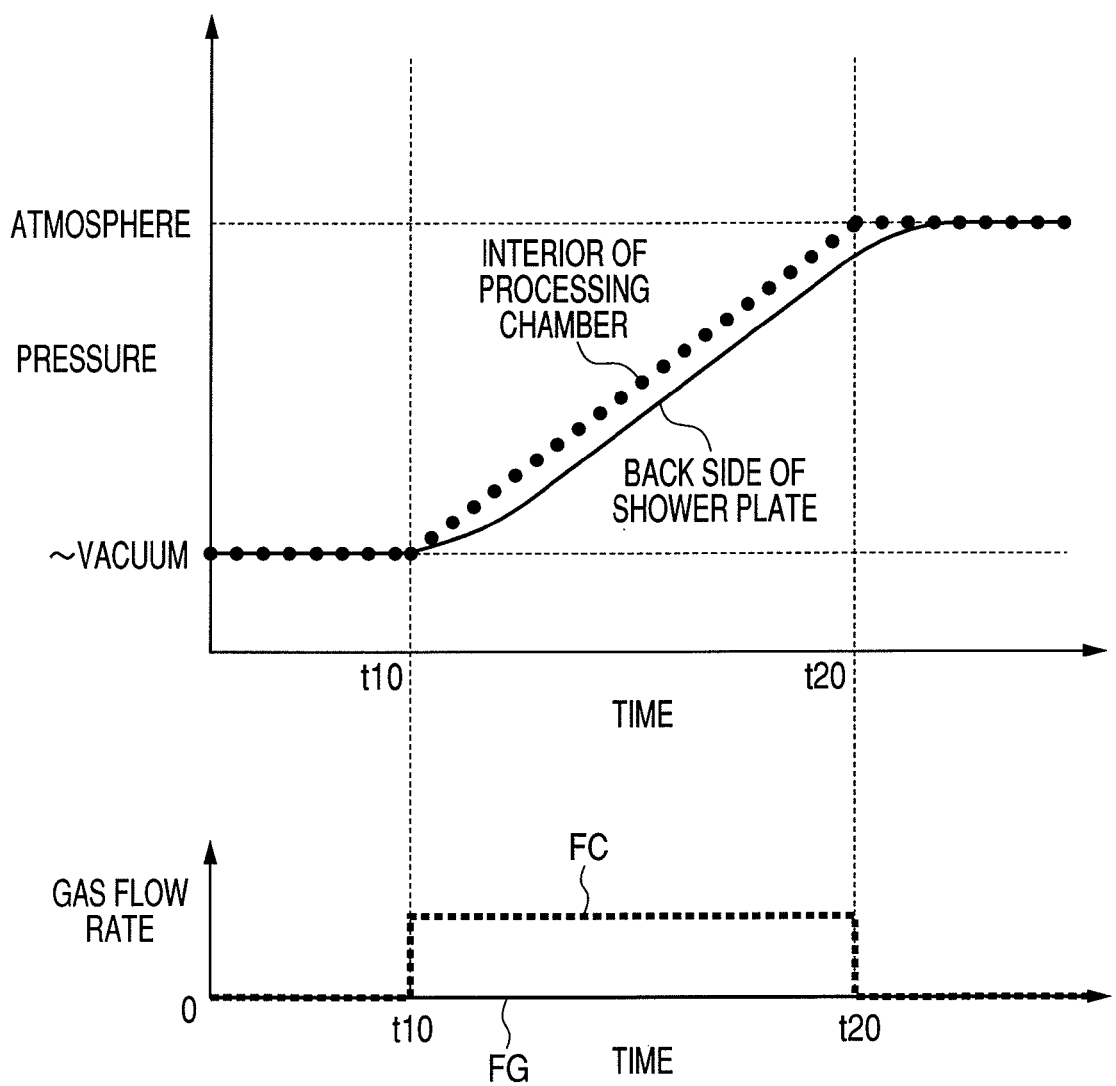
FIG. 8 is a view showing pressure changes of the back side of the shower plate and the interior of the processing chamber at the time of returning the interior of the processing chamber to atmosphere from vacuum according to a conventional method.
Figure 9:
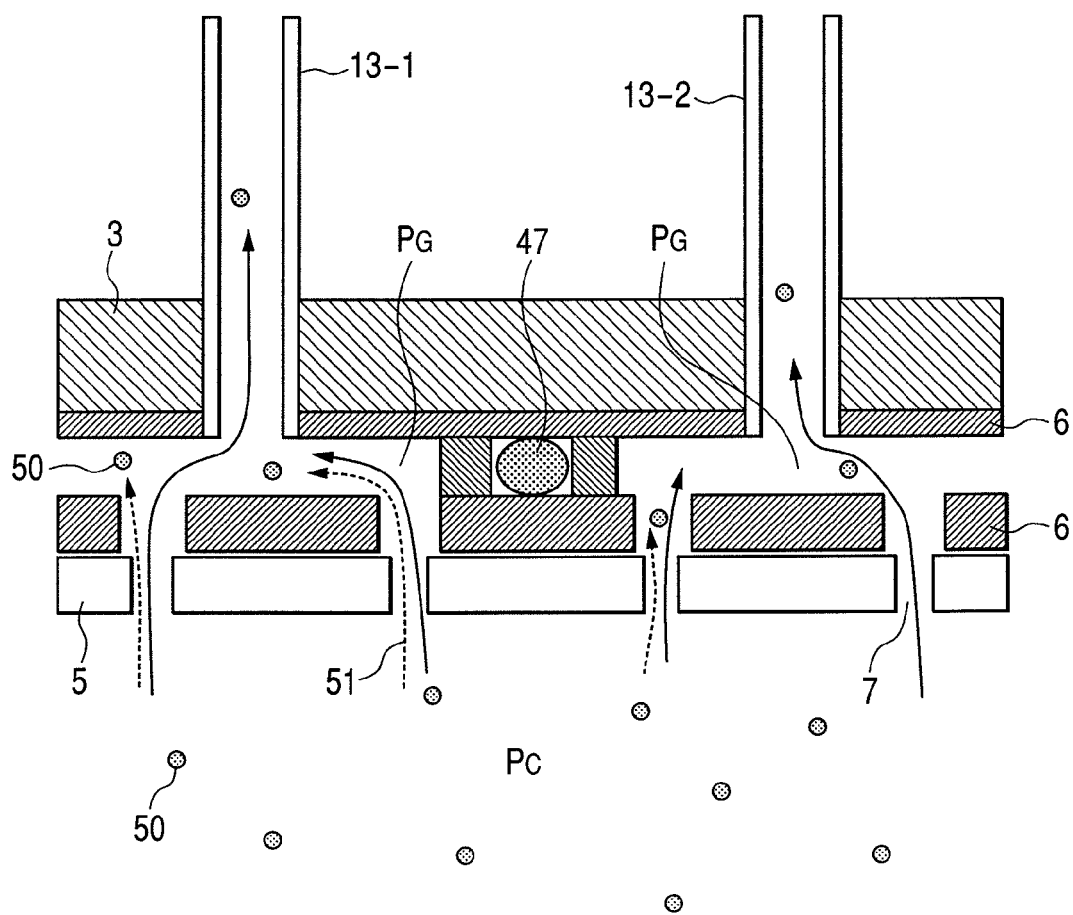
FIG. 9 is a schematic enlarged view of a portion on the back side of the shower plate.

Next, the effect of the present invention will be discussed. In the conventional method, as discussed above with reference to FIGS. 8 and 9, there is the problem that the foreign material particles that are flown up in the processing chamber by the supply of the vent gas are caused to enter the back side of the shower plate from the side of the processing chamber by the flow of the gas and contaminate the back side of the shower plate and/or the interiors of the pipes of the processing gas supply system.

Figure 5:
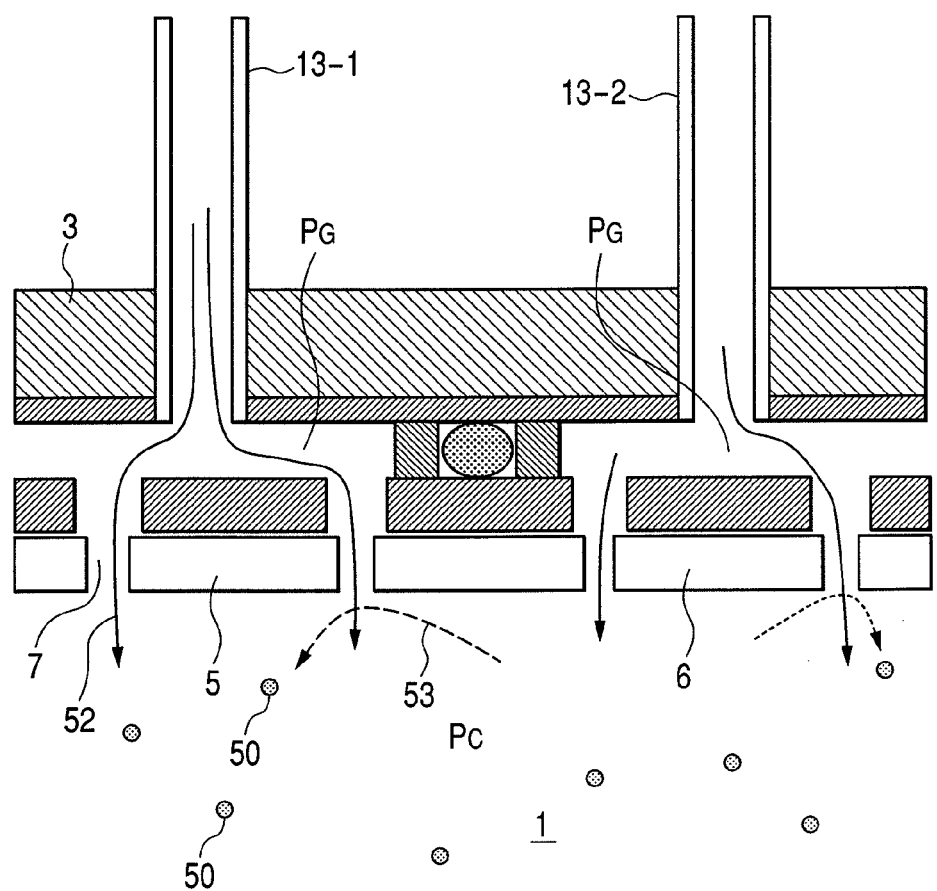
FIG. 5 is a view which illustrates a portion corresponding to a region A in FIG. 1 and is of assistance in explaining the effect of the present invention.

In order to restrain this, according to the present invention, the supply of gases from the side of the shower plate is also carried out while supplying the gases for venting into the processing chamber as shown in FIG. 5. FIG. 5 illustrates a region corresponding to a region A in FIG. 1. That is, if the flows of such gases as to be supplied into the processing chamber from the shower plate are created as indicated in FIG. 5 by thick lines 52, a trajectory of the foreign material particles becomes such a trajectory 53 as indicated in FIG. 5 by a broken line and the foreign material particles 50 that are flown up in the processing chamber can be prevented from entering the gas holes of the shower plate.

Figure 6:
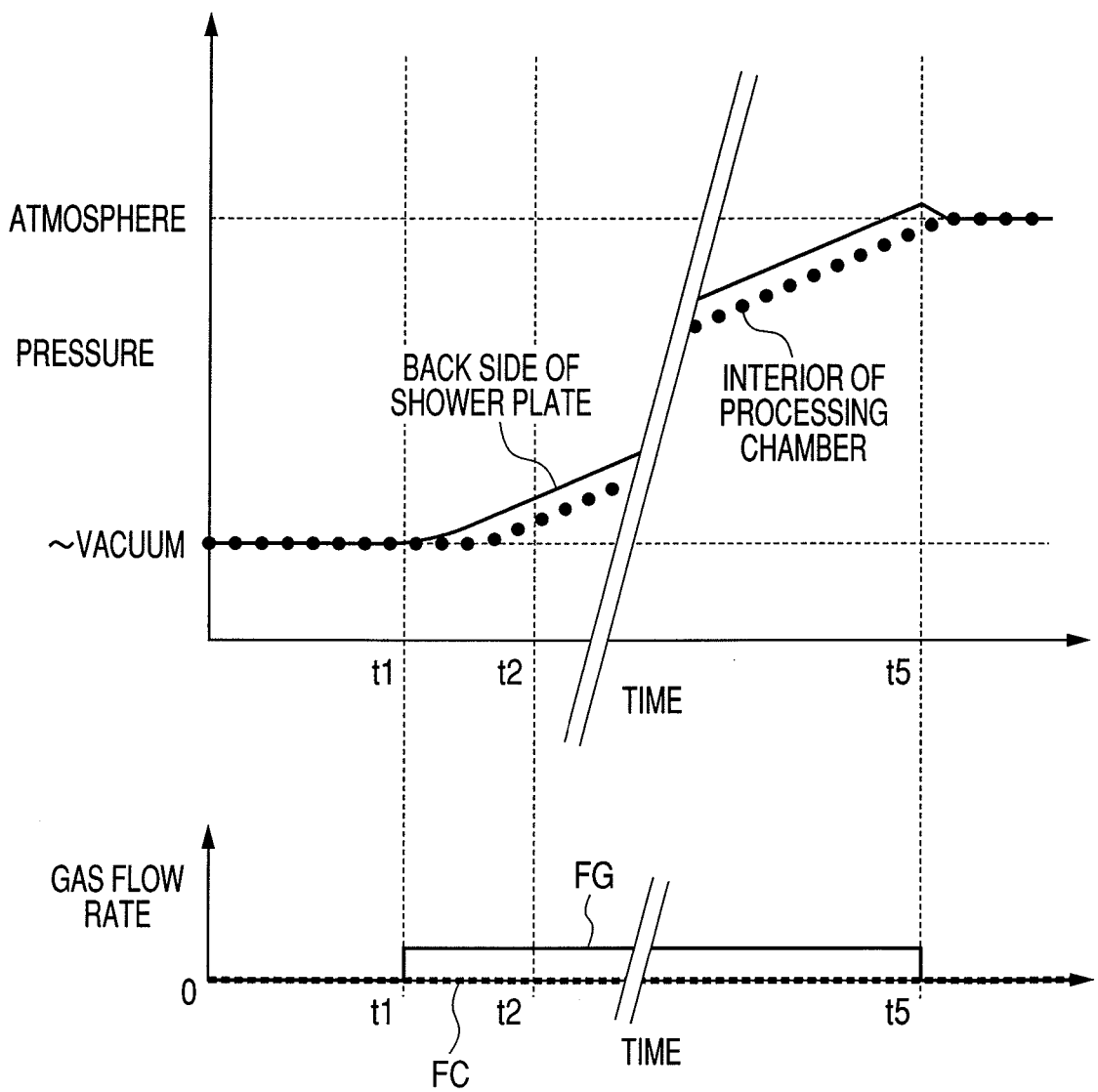
FIG. 6 is a view which is of assistance in explaining a comparative example's problems.

Incidentally, as a method for creating such flows of the gases as indicated in FIG. 5, there is a method in which, for example, in a plasma processing apparatus that is not provided with such a vent gas supply system 49 as shown in FIG. 1, the processing apparatus is vented to the atmosphere by supplying the vent gas via the shower plate (the first gas supply path) only. In this case, however, it is necessary not to cause the pressure on the back plane of the shower plate to become excessively high and there is a problem that time required until the timing (t5) of the interior of the processing chamber 1 reaching the atmospheric pressure as shown in FIG. 6 as a comparative example increases, that is, time taken for the venting increases. This reason will be discussed hereinafter.

For example, it is assumed that the vent gases are supplied to the shower plate at a pressure of the same level as the atmospheric pressure. Immediately after the venting is commenced, the front side (the interior of the processing chamber) of the shower plate is evacuated and the back side of the shower plate becomes the atmospheric pressure. In a case of a plasma processing apparatus that processes a wafer having a diameter of 300 mm, the diameter of the shower plate is often more than that of the object to be processed, for example, 300 mm to 400 mm. In this case, the force which is applied toward the front side from the back side with respect to the shower plate becomes as much as about 1000 Kg.

Generally, in the condition where the processing gas is supplied during the plasma processing, the pressure on the back side of the shower plate is, for example, 1 KPa (for example, the flow rate of the processing gas is 500 mL/min) and the force applied onto the back side of the shower plate is 10 Kg or so. On the other hand, the pressure in the processing chamber is, for example, not more than several tens Pa and, at this time, the force applied onto the front side the shower plate is not more than 1 Kg. Therefore, the shower plate is pushed against the side of the processing chamber (downward direction) at a force of about 10 Kg. For such a reason, the withstanding force of the shower plate (including a screw-fixed structure section, etc.) is set to, for example, 100 Kg. The material of the shower plate is silicon, quartz, etc. In order that the shower plate can withstand a force of, for example, 1000 Kg, a step to reduce the area of the shower plate, or a step to increase the thickness of the shower plate, or a step to change the material of the shower plate is required. Moreover, strong holding force is required for screws fixing the shower plate, etc. and it is impossible to easily enhance the withstand pressure.

For such reasons, the flow rate of the vent gas supplied from the shower plate is set to, for example, 3 L/min. If the volume of the chamber is set to 50 L, time taken for the venting (t5 in FIG. 6) is 17 minutes. In the case of an apparatus having the same vent gas supply system as the apparatus according to the present invention does, the flow rate of the vent gas can be set to, for example, 25 L/min as discussed hereinafter, so that venting time is about two minutes. The main objective of the venting to atmosphere is total cleaning (wet cleaning), namely, replacement of swap parts in the chamber (parts to be periodically removed and cleaned). Time that is taken from the completion of the venting to the completion of the replacement of the swap parts is, for example, 30 minutes, so that if the venting time is increased, the resting time of the apparatus that is taken for the total cleaning is increased to an unnegligible level and the productivity of the apparatus becomes decreased.

Therefore, as shown in FIG. 3, the present invention makes it possible to supply the vent gas from the vent gas supply system and also supply the vent gas from the shower plate, while controlling the pressure on the back side of the shower plate in such a manner that it becomes a positive pressure relative to the pressure in the processing chamber, in a predetermined range ($P_D$ in FIG. 3) during the venting.

Figure 4:
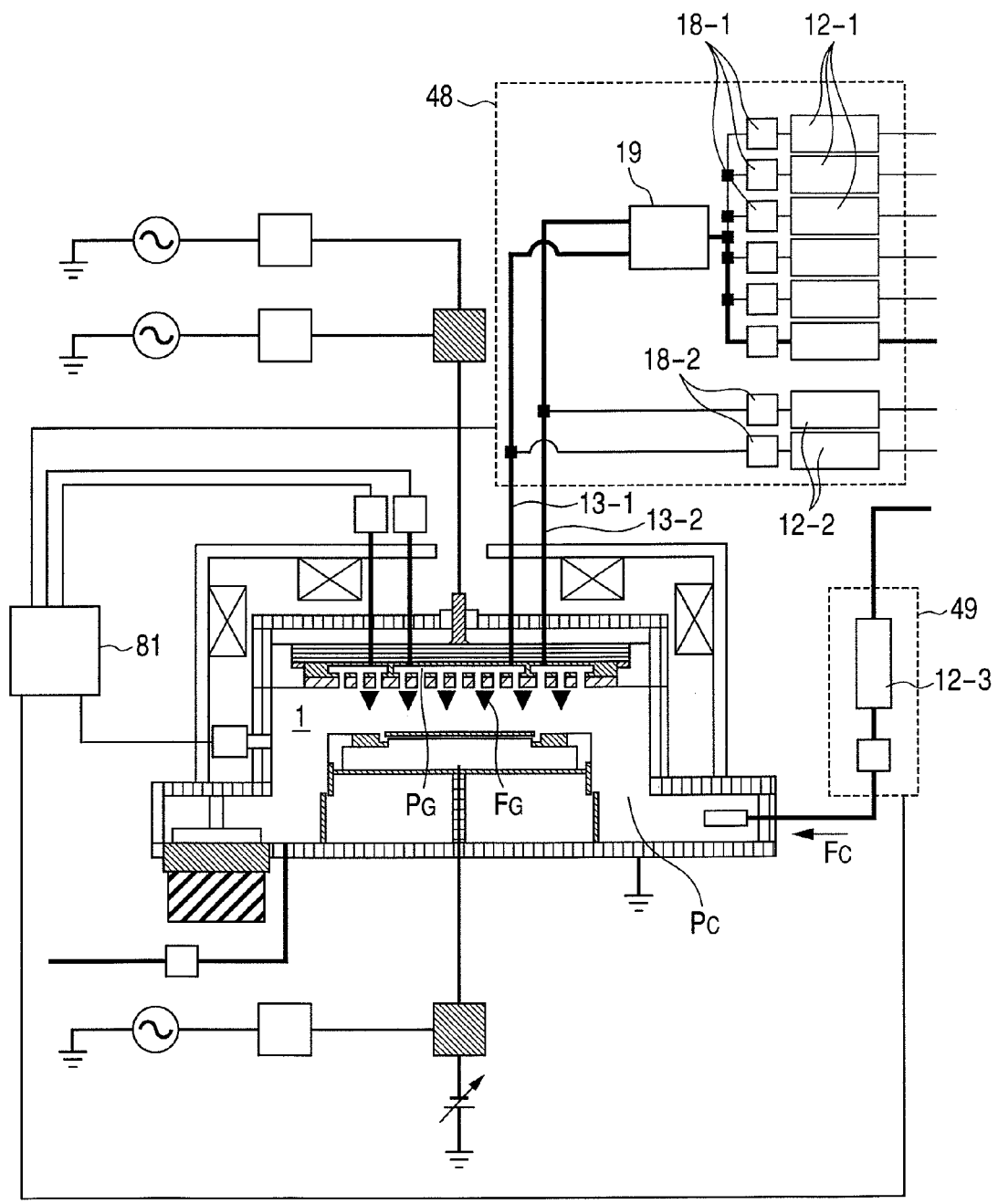
FIG. 4 is a view illustrating an example of a manner to supply the gas during venting in the first embodiment.

Referring to FIG. 4, there is illustrated an example of the manner to supply the gas during the venting in the embodiment according to the present invention. The gas pipes are indicated by two kinds of lines, thick lines and fine lines. Portions indicated by the thick lines show that the gases have passed therein. During the venting, the supply of the gas from the processing gas supply system is also carried out while supplying the vent gas into the processing chamber from the vent gas supply system. The control computer 81 is adapted to control the flow rate $F_G$ of the gas supplied via the shower plate into the processing chamber from the processing gas supply system and the flow rate $F_C$ of the vent gas supplied into the processing chamber from the vent gas supply system without via the shower plate, in such a manner that the pressure on the back side of the shower plate becomes a positive pressure relative to the pressure in the processing chamber in a predetermined pressure range (for example, a pressure of 1/10 of the withstand pressure of the shower plate), while monitoring the pressure $P_C$ in the processing chamber and the pressure $P_G$ on the back side of the shower plate via the pressure gauges 14-1, 14-2, 14-3.

As the gas supplied from the processing gas supply system and the gas supplied from the vent gas supply system, it is preferable to employ nitrogen air, dry air, etc. Moreover, while the gas is supplied from the mass-flow controller system 12-1 in FIG. 4, the vent gas may be also supplied from the mass-flow controller 12-2, depending on the type of gases used for the venting.

Next, the upper and lower limits of the flow rates of the gases flowing during the venting which are shown in FIG. 4 will be explained utilizing numerical formulae. If the volume of the processing chamber is $V_C$, the volume on the back side of the shower plate (including the volume of the interiors of the gas pipes extending to a dispersion region of the gas dispersion plate and the valves 81-1, 81-2) is $V_G$, and time taken for the venting is $T_V$, $$T_V = (V_C + V_G)/(F_C + F_G) \quad (1)$$

Generally, $V_C \gg V_G$, so that $F_C \gg F_G$ is required in order not to allow excessive force to be applied to the back side of the shower plate. Therefore, the formula (1) can be simplified as a formula (2).

$$T_V = V_C/F_C \quad (2)$$

For example, if the volume $V_C$ in the processing chamber is 50 L and the venting time $T_V$ (if t2 and t3 in FIG. 3 are used, $T_V = t3-t2$) is two minutes, the flow rate $F_C$ of the vent gas amounts to 25 L/min.

The pressure $P_C$ in the processing chamber and the pressure $P_G$ of the shower plate during the venting are represented as a formula (3) and a formula (4), respectively, utilizing time taken from the commencing of the venting.

$$P_C = F_C \times t/V_C \quad (3)$$

$$P_G = F_G \times t/V_G \quad (4)$$

where it is assumed that the going and coming of the gases between the processing chamber and the back side of the shower plate via the gas holes of the shower plate are negligible. The condition of the pressure $P_C$ in the processing chamber and the condition of the pressure $P_G$ of the shower plate, during the venting, according to the elapse of time, are shown in FIG. 3 by the broken line and the solid line, respectively.

In order that the pressure on the back side of the shower plate becomes higher than the pressure in the processing chamber, PC<PG that is represented as the following expression of relation (5) if the formulae (3) and (4) are used.

$$F_C/V_C < F_G/V_G \quad (5)$$

where if it is assumed that the volume $F_G$ including the gas pipes, etc. on the back side of the shower plate is, for example, 1 L, by using the formula (5), $$25/50 < F_G/1 \quad (6),$$

and, thereby, $F_G > 0.5$ L/min.

Incidentally, the flow rate of the processing gas is generally several tens to several hundreds mL/min, so that the flow rate of, for example, 0.5 L/min (500 mL/min) is often in the control range of the general mass-flow controller 12-1. Therefore, if the gas flowing during the venting is, for example, nitrogen gas and a maximum flow rate of the nitrogen gas allowed to flow as the processing gas by the mass-flow controller 12-1 is more than 500 mL/min, a specialized mass-flow controller, etc. for use in the venting are not required to be installed in the processing gas supply system.

Further, if a sum of the conductances of the gas holes of the shower plate is $C_S$, a relation between the pressure $P_G$ applied to the back side of the shower plate and the pressure $P_C$ in the processing chamber is represented by the following formula (7).

$$F_G = C_S(P_G - P_C) \quad (7)$$

If $P_G \gg P_C$ at the time of commencing the venting, $$F_G = C_S \times P_G \quad (8)$$

where the withstand pressure of the shower plate is $P_L$, a relation between $F_G$ and $P_L$ must be $$F_G < P_L \quad (9),$$

so that if the formula (8) is substituted in the formula (9), $$F_G/C_S < P_L \quad (10).$$

For example, when the gas is caused to flow at a flow rate of 500 mL/min, if the pressure on the back side of the shower plate amounts to 1 KPa, the conductance CS is, by the formula (8), $$0.5[\text{L/min}] = C_S \times 0.01[\text{atm}] \quad (11),$$

and CS=50 L/min. Incidentally, the gas flow rate shows a flow rate in standard condition, so that in the unit of the gas flow rate [L/min], the unit of a pressure is omitted. In a case where the unit of a pressure is not omitted, the unit is, for example, [atm·L/min].

If the withstand pressure of the shower plate is 0.1 atm, the upper limit of the gas flow rate $F_G$ is, by the formula (10), $$F_G < 0.1[\text{atm}] \times 50[\text{L/min}] = 5[\text{L/min}] \quad (12).$$

If the formula (5) is combined with the formula (10), the upper and lower limits of the flow rate $F_G$ of the gas caused to flow from the shower plate are obtained and represented by a formula (13).

$$V_G \times F_C/V_C < F_G < C_S \times P_L \quad (13).$$

If the above mentioned example is summarized, the supplying amount $F_C$ of the vent gas from the vent gas supply system is $F_C$=25 L/min, the supplying amount $F_G$ of the vent gas from the processing gas system is 0.5 L/min<$F_G$<5 L/Min, and the venting time is about two minutes.

That is, the control means adjusts the flow rate $F_G$ of the vent gas supplied into the processing chamber from the first gas supply path in such a manner that it becomes a range of ⅕ to ¹⁄₂₅ of the flow rate $F_C$ of the vent gas supplied into the processing chamber from the second gas supply path. By adjusting the gas supplying amount in this manner, it is possible to obtain the effects: it is possible to prevent the back side of the shower plate from being contaminated by the foreign material particles, without breaking the shower plate and it is possible reduce the venting time.

Of course, the above values are the inherent values of the apparatus and values that are varied depending on the structure of the apparatus.

Incidentally, in the case where the flow rate $F_G$ of the gas supplied from the shower plate is increased, one of the mass-flow controllers 12-1 may be configured as a mass-flow controller to allow the gas to flow at a large flow rate, and inexpensive gas such as dry air may be supplied from the gas sources.

Further, as shown in FIG. 1, the gas diffuser 54 is employed at a portion of the vent gas supply system which supplies the gas into the processing chamber. This is for the benefit of preventing the supplied gas from being forcibly injected in a specified direction. Thereby, the foreign material particles are prevented from being flown up by the supply of the vent gas. As the surface of the gas diffuser, a porous sintered material is used.

As discussed above, according to the embodiment of the present invention, the venting is carried out while restricting the pressures on the back side and front side of the shower plate to the predetermined range, whereby the venting is performed without destroying the shower plate, while allowing the gas to flow from the shower plate, so that it is possible to prevent the back side of the shower plate from being contaminated by the foreign material particles. Moreover, it is possible to reduce the venting time and possible to reduce the resting time of the apparatus that is taken for the total cleaning, so that the productivity of the apparatus is improved.

Second Embodiment

Figure 7:
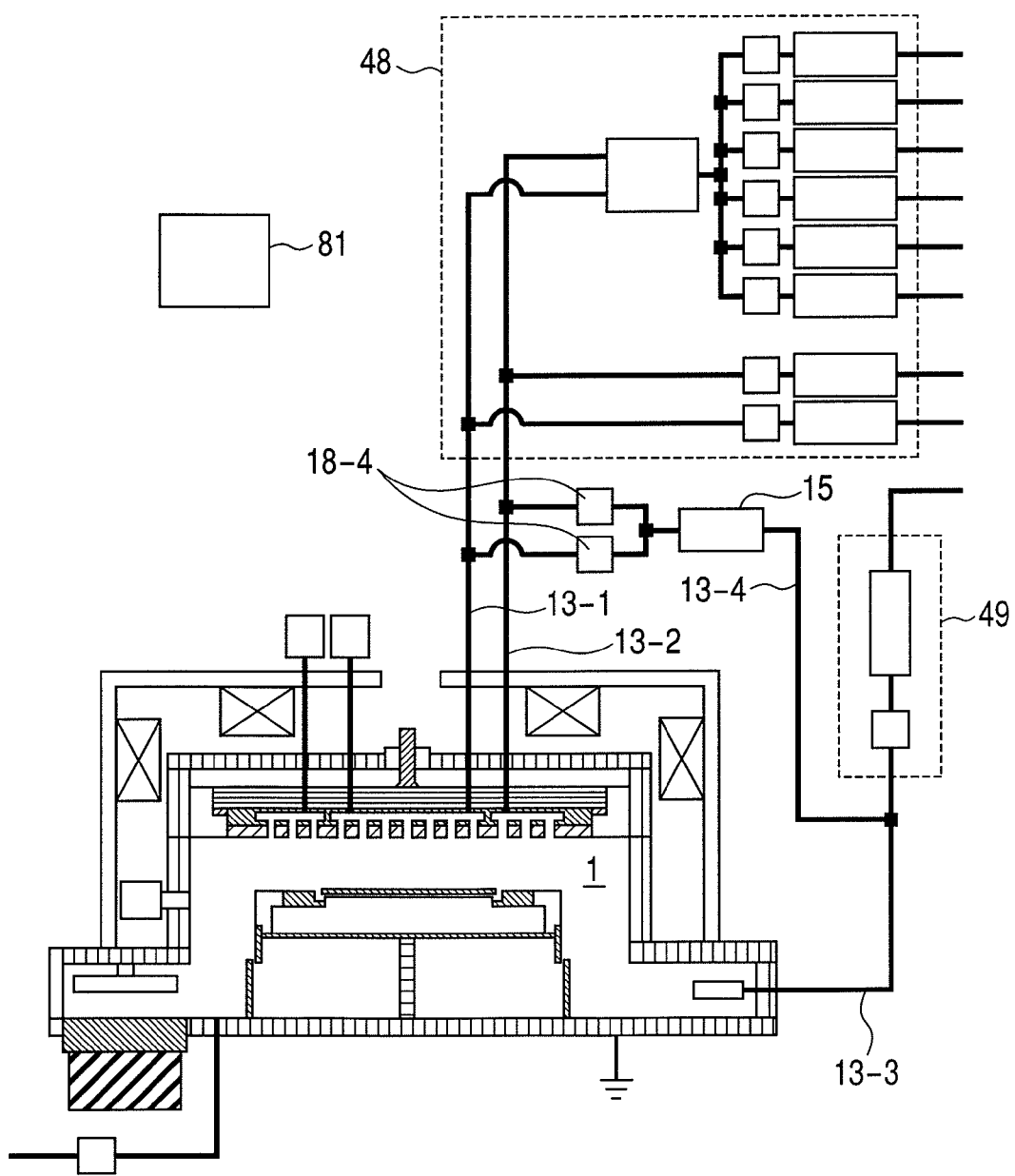
FIG. 7 is a view showing a second embodiment in which the present invention is applied to a parallel-plate UHF-ECR plasma etching apparatus.

Next, a second embodiment of the present invention will be discussed with reference to FIG. 7. The description of components similar to those of FIG. 1 will be omitted. In the example of FIG. 7, a gas tube is branched into two sections at a downstream side of the vent gas supply system 49 for supplying the vent gas into the processing chamber, one of the gas tube sections is connected to the processing chamber 1, the other of the gas tube sections is connected to a gas pipe of a downstream side of the processing gas supply system 48, and the vent gas to be supplied from the vent gas supply system can also be supplied from the shower plate. Moreover, in order that the pressure on the back side of the shower plate does not become higher than the withstand pressure of the shower plate relative to the pressure in the processing chamber during venting, a pressure control valve 15 for adjusting the flow rate of the vent gas supplied from the shower plate 5 is connected to a portion adjust an upstream side rather than connecting locations to which the gas lines 13-1, 13-2 are connected. This makes it possible to suppress the pressure differential between the back and front sides of the shower plate to a level that is not more than the withstand pressure of the shower plate.

In this embodiment, the venting is carried out while suppressing the pressures of the back and front sides of the shower plate in the predetermined range, so that the venting is performed without breaking the shower plate while supplying the gases from shower plate, whereby the back side of the shower plate can also be prevented from being contaminated by the foreign material particles. Moreover, the venting time can be reduced and the resting time of the apparatus that is taken for the total cleaning can be reduced, so that the productivity of the apparatus is increased.

While the embodiments according to the present invention have been discussed above by utilizing the examples in which the present invention is applied to the plasma etching apparatuses, the present invention can be applied widely to another semiconductor-device-fabricating apparatus that has a component equivalent to the shower plate and performs processing under a decompressed state, as well as a plasma CVD apparatus.

What is claimed is:

1. A gas supply method in a plasma processing apparatus, wherein the plasma processing apparatus includes a processing chamber for processing an object to be processed, a turbo molecular pump for decompressing the processing chamber, a sample holding electrode being provided in the processing chamber, a gas supply system for supplying a gas into the processing chamber, a high frequency electromagnetic radiation power supply for generating plasma in the processing chamber, and a control computer, wherein the gas supply systems includes a first gas supply path for supplying a gas into the processing chamber by way of a shower plate provided in the processing chamber, the shower plate having a back side facing the first gas supply path, and a second gas supply path for supplying a gas into the processing chamber directly, without passing through the shower plate;

wherein the control computer is configured so as to be capable of adjusting flow rates of the gases from the first and second gas supply paths and selectively supplying a processing gas or a vent gas into the processing chamber; and wherein in a condition where decompressing operation for the processing chamber by the turbo molecular pump is stopped when the processing chamber in vacuum atmosphere is to be vented to atmosphere, the method comprises steps of:

supplying the vent gases into the processing chamber from both the first gas supply path and the second gas supply path, while suppressing a differential pressure between a pressure in the processing chamber and a pressure on the back side of the shower plate to a pressure less than a withstand pressure of the shower plate.

2. A method for venting to atmosphere in a plasma processing apparatus, wherein the plasma processing apparatus includes a processing chamber for processing an object to be processed, a turbo molecular pump for decompressing the processing chamber, a sample holding electrode being provided in the processing chamber, a shower plate provided in confronting relation with the sample holding electrode, the shower plate having a back side opposite to the side thereof in confronting relation with the sample holding electrode, a gas supply system having a first vent gas supply path for supplying a vent gas into the processing chamber by way of the shower plate and a second vent gas supply path for supplying a vent gas into the processing chamber directly, without passing through the shower plate, a high frequency electromagnetic radiation power supply for generating plasma in the processing chamber, a pressure gauge for measuring pressure in the processing chamber, pressure gauges for measuring a pressure at the back side of the shower plate, and a control computer, wherein the control computer is capable of adjusting a flow rate of a vent gas supplied into the processing chamber through the first vent gas supply path and through the second vent gas supply path when the processing chamber in vacuum atmosphere is to be vented to atmosphere, wherein the method comprises steps of:

supplying the vent gas, via the first vent gas supply path going by way of the shower plate, into the processing chamber, and then supplying the vent gas via the second vent gas supply path, while adjusting flow rates in such a manner that a pressure on the back side of the shower plate becomes a pressure that is a positive pressure relative to the pressure in the processing chamber and less than a withstand pressure of the shower plate;

wherein, at the time of supplying the vent gas into the processing chamber from the first vent gas supply path and causing the pressure on the back side of the shower plate to become the positive pressure relative to the pressure in the processing chamber at the pressure less than the withstand pressure of the shower plate, the supply of the vent gas into the processing chamber from the second vent gas supply path is started;

when the pressure in the processing chamber becomes atmospheric pressure, stopping supply of the vent gas from the second vent gas supply path; and thereafter stopping the supply of the vent gas via the first vent gas supply path.

3. The method for venting to atmosphere in a plasma processing apparatus according to claim 2, wherein, in a case where a volume on the back side of the shower plate is $V_G$, a flow rate of the vent gas supplied from the second vent gas supply path is $F_C$, a volume of the processing chamber is $V_C$, a sum of conductances of gas holes formed in the shower plate is $C_S$, and the withstand pressure of the shower plate is $P_L$, a flow rate $F_G$ of the vent gas supplied from the first vent gas supply path satisfies the requirements according to the following formula (13):

$$V_G \times F_C / V_C < F_G < C_S \times P_L \qquad (13).$$

4. The method for venting to atmosphere in a plasma processing chamber according to claim 2, wherein at the time of the pressure in the processing chamber reaching an atmospheric pressure, the supply of the vent gas into the processing chamber from the second vent gas supply path is stopped; and after a predetermined time elapses after the stopping of the supply of the vent gas into the chamber from the second vent gas supply path, the supply of the vent gas into the processing chamber from the first vent gas supply path is stopped or continued.

\* \* \* \* \*